United States Patent [19]

Van Den Beemt

[11] Patent Number: 4,542,512
[45] Date of Patent: Sep. 17, 1985

[54] SEMICONDUCTOR LASER HAVING A METAL-FILLED GROOVE FOR IMPROVED COOLING AND STABILITY

[75] Inventor: Johannes A. C. Van Den Beemt, Eindhoven, Netherlands

[73] Assignee: U.S. Philips Corporation, New York, N.Y.

[21] Appl. No.: 481,006

[22] Filed: Mar. 31, 1983

[30] Foreign Application Priority Data

Apr. 2, 1982 [NL] Netherlands ............ 8201409

[51] Int. Cl.⁴ .................................. H01S 3/19
[52] U.S. Cl. ........................... 322/46; 357/17; 357/68; 357/81; 372/36
[58] Field of Search ............ 372/44, 45, 46, 36; 357/17, 65, 68, 71, 81

[56] References Cited

U.S. PATENT DOCUMENTS 4,278,949  7/1981  Marschall et al. ............ 372/46
4,416,011 11/1983  Olsen ............................ 372/46
4,454,603  6/1984  Marshall et al. ............. 372/46

Primary Examiner—James W. Davie
Attorney, Agent, or Firm—Robert T. Mayer; Steven R. Biren

[57] ABSTRACT

A semiconductor laser of the DH-type has a first and a second passive layer, an interposed active layer and a top layer which may be disposed on the second passive layer. In the surface, a preferably V-shaped groove is provided on the side of the second passive layer, which groove extends at most over only part of the thickness of the second passive layer. According to the invention, the groove is filled selectively with a metal, preferably gold, up to the level of the surface, while on both sides of the groove there is present an insulating region, which is preferably obtained by proton implantation and does not extend up to the active layer. The invention also relates to a method in which the insulating region is provided in a self-aligned manner by ion implantation while using the metal as a mask. The groove is preferably filled with gold by an electroless method.

8 Claims, 6 Drawing Figures

SEMICONDUCTOR LASER HAVING A METAL-FILLED GROOVE FOR IMPROVED COOLING AND STABILITY

BACKGROUND OF THE INVENTION

The invention relates to a semiconductor laser having a semiconductor body comprising at least a first passive semiconductor layer of the first conductivity type, an active semiconductor layer disposed thereon and a second passive semiconductor layer of the second opposite conductivity type disposed on the active layer. A pn junction being present between the first and the second passive layer and a groove is provided on the side of the second passive layer in the surface of the semiconductor body, which groove extends at most over only part of the thickness of the second passive layer. Upon application of a voltage in the forward direction across the pn junction, coherent electromagnetic radiation can be produced in a strip-shaped part of the active layer lying below the groove and situated between two reflecting side faces of the semiconductor body substantially at right angles thereto, for which radiation the passive layers have a lower refractive index than the active layer.

The invention also relates to a method of manufacturing the semiconductor laser.

A semiconductor laser of the kind described is known from the British Patent Application No. 2021307, laid open for public inspection.

In semiconductor lasers in which radiation is produced in a strip-shaped active region, one of the main problems is that an efficient heat dissipation from the strip-shaped region must be ensured. For this purpose, a region of very low heat resistance must be present between the active strip-shaped region situated at a certain depth under the surface of the crystal and a heat sink or cooling plate. In fact, an excessively high temperature of the active region leads to an increase of the threshold current and to other disadvantageous effects on the laser action.

Another main problem is that so-called self-pulsations are produced. These instabilities ("kinks") in the radiation-versus-current characteristic are particularly disadvantageous when the laser is used in optical telecommunication systems.

These self-pulsations are suppressed to a considerable extent in a laser structure as described in the aforementioned British Application. In this known laser structure, the semiconductor body is composed of layers of gallium arsenide and gallium aluminum arsenide, while a semiconductor top layer is formed on the second passive layer and a zinc diffusion is effected in the groove up to a certain distance from the active layer. In order to limit the current to the active strip-shaped region, the top layer is of the first conductivity type, opposite to that of the second passive layer, which necessitates an adaptation with respect to the layer structure generally used for double hetero-junction lasers (DH-lasers). This known semiconductor laser must be soldered on a cooling plate at the side on which the groove is provided, in which event the solder must fill the groove completely in order to ensure a good heat transfer. Due to inclusions, in particular gas bubbles, however, the latter is realized insufficiently in many cases, even with special measures. This directly influences the laser characteristic.

SUMMARY OF THE INVENTION

The invention has for its object inter alia to provide a semiconductor laser having a novel structure, in which both an efficient cooling and a satisfactory stabilization of the radiation-versus-current characteristic are obtained and in which it is not necessary to modify the layer structure normally used for DH-lasers.

A semiconductor laser in accordance with the invention is therefore characterized in that the groove is filled selectively with a metal at least up to the level of the surface and in that on both sides of the metal an electrically substantially insulating region is present which adjoins this metal and extends from the surface over part of the thickness of the second passive layer.

In the semiconductor laser according to the invention, the metal with which the groove is filled selectively and which is thus not present outside the groove has a triple function. First, it provides a very efficient cooling by dissipating the heat at the area at which it is generated, i.e. in the proximity of the bottom of the groove. Further, because the metal fills the groove completely, it provides a substantially planar surface without cavities, which can be readily soldered on a cooling plate wihout inclusions by means of an independently-chosen soldering material. Finally, as will be further explained below, the metal which fills the groove serves at the same time as a mask during the formation of the electrically substantially insulating regions, which consequently adjoin the metal on both sides in a self-aligned manner.

Due to the presence of these substantially insulating regions in a semiconductor laser according to the invention, the top layer, if any, as well as the second passive layer may be of the second conductivity type, as a result of which the same layer structure may be used as in used for conventional double hetero-junction lasers having a top layer. Moreover, it has proved possible in a semiconductor laser according to the invention that, even when no zinc diffusion in the groove of the known laser is effected, a satisfactorily-operating laser can be obtained. This is in contrast with the known groove laser, in which the zinc diffusion is always necessary due to the presence of the n-type conducting top layer.

The desired concentration of the current in a strip-shaped active part of the active layer can be attained to a sufficient extent by the mere presence of the metal-filled groove. However, under given conditions, it may be advantageous, inter alia for improving the ohmic contact between the metal and the wall of the groove, that a highly doped surface layer of the second conductivity type adjoins the groove wall and extends at most over only part of the thickness of the second passive layer. This surface layer is preferably formed by means of a zinc diffusion, although under appropriate conditions other dopants, for example, magnesium or beryllium, may be used. The metal with which the groove is filled preferably consists mainly of gold. This metal not only has a very high thermal conduction, but can also be provided by means of very simple methods. Furthermore, it is very suitable for masking during the formation of the electrically insulating region, which is preferably provided by means of proton bombardment.

Although other semiconductor materials may also be used, the various semiconductor layers consist, according to a preferred embodiment, of gallium arsenide and/or gallium aluminum arsenide.

A very suitable method of manufacturing the semiconductor laser according to the invention is characterized in that a highly doped substrate is successively provided with a first passive semiconductor layer of a first conductivity type, an active semiconductor layer and a second passive semiconductor layer of the second conductivity type, in that then an etching mask with a strip-shaped aperture is provided on the surface, whereupon inside this aperture a groove is etched, which extends over at most part of the thickness of the second passive layer, in that then the groove is selectively filled with a metal up to at least the level of the surface, in that then with the use of the said metal as a mask a proton bombardment is carried out, as a result of which on both sides of the groove an electrically substantially insulating region is formed which extends over part of the thickness of the second passive layer, and in that subsequently reflecting side faces substantially at right angles to the groove are formed.

BRIEF DESCRIPTION OF THE DRAWING

The invention will now be described more fully with reference to a few embodiments and the drawing, in which.

The Figures are schematic and not drawn to scale. Semiconductor regions of the same conductivity type are cross-hatched in the same direction. Corresponding parts are generally designated by the same reference numerals.

DESCRIPTION OF THE PREFERRED EMBODIMENTS

Figure 1:
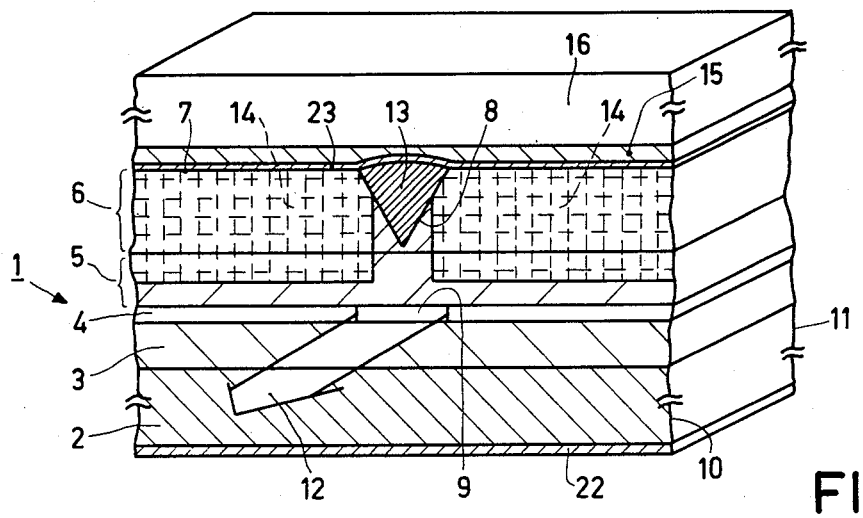
FIG. 1 shows a semiconductor laser according to the invention partly diagrammatically in cross-section and partly in perspective view.

FIG. 1 shows partly in cross-section and partly in perspective view a semiconductor laser according to the invention. The semiconductor laser has a semiconductor body 1 which comprises a first passive semiconductor layer 3 of the first conductivity type disposed on a substrate 2 of a first conductivity type, an active semiconductor layer 4 disposed thereon, a second passive semiconductor layer 5 of the second opposite conductivity type disposed on the active layer 4 and a semiconductor top layer 6 disposed on this second passive layer 5 and adjoining a surface 7 of the semiconductor body. In the surface 7 of the semiconductor body located on the side of the second passive layer 5 there is provided a groove 8 which extends over substantially the whole thickness of the top layer 6.

At the interface between the active layer 4 and one of the passive layers 3 or 5, depending upon the conductivity type of the active layer, there is situated a pn junction with a forward direction and a reverse direction. Upon application of a voltage in the forward direction across this pn junction, and at a sufficiently high forward current, coherent electromagnetic radiation which leaves the semiconductor body as a beam 12 may be generated in a strip-shaped part 9 of the active layer which is located below the groove 8 and is situated between two reflecting side surfaces or mirror surfaces 10 and 11 of the semiconductor body substantially at right angles to the strip-shaped active part 9. The passive layers 3 and 5 have a lower refractive index for the said radiation than the active layer 4.

A prior art semiconductor laser of the general construction described hitherto is known from British Patent application No. 2021307. In that case, the top layer 6 is of the first conductivity type opposite to that of the second passive layer 5, while into the walls of the groove 8 there is diffused a surface layer of the second conductivity type which is in contact with the second passive layer 5.

According to the invention, the groove 8 is selectively filled at least up to the level of the surface 7 with a metal 13 which forms a substantially ohmic contact with the walls of the groove 8, while on both sides of this metal 13 there is disposed an electrically substantially insulating region 14 adjoining this metal. This region 14 extends from the surface 7 over part of the thickness of the second passive layer 5, and in this example comprises implanted protons.

The semiconductor laser described is soldered by means of a soldering material 15, in this example an indium solder, to a heat sink 16, for example, a copper cooling plate, on the side of the groove 8. Due to the fact that the groove 8 is filled completely with the metal 13, there is no risk of inclusions or cavities being formed, which could adversely affect the heat transfer. The heat generated in or near the strip-shaped region 9 in the proximity of the bottom of the groove 8 is dissipated efficiently through the metal 13 to the cooling plate. Further, as will be explained more fully below, the metal 13 may be used as a mask for providing the insulating regions 14 in a self-aligned manner.

In the structure described here, the top layer 6 is of the second conductivity type, the same conductivity type as the second passive layer 5. This is in contrast with the laser known from British Patent Application No. 2021307.

A basic structure for realizing the semiconductor laser according to the invention may consequently be a laser structure, such as is used for conventional double hetero-junction lasers. The technology used and tested for the manufacture of these layer structures can thus be utilized substantially without changes, which is advantageous in many cases.

The groove used in this example is V-shaped. Such a groove can be realized in a simple manner by the use of selective etching means. However, grooves with other profiles may also be used under appropriate conditions. In this example, the metal 13 with which the groove is filled consists of gold, which has favorable heat-conducting and masking properties. Under appropriate conditions, however, other good conducting metals or alloys may be used. The layer structure used in this example has the following construction:

| Layer | Material | Thickness ($\mu$m) | Doping (atoms/cm$^3$) | |
|---|---|---|---|---|
| 2 (substrate) | N GaAs | 90 | Si | $10^{18}$ |
| 3 | N Al$_x$Ga$_{1-x}$As | 2 | Sn | $10^{17}$ |
| 4 (active) | (n$^-$)Al$_y$Ga$_{1-y}$As | 0,2 | undoped | |
| 5 | p Al$_x$Ga$_{1-x}$As | 1,9 | Ge | $5 \times 10^{17}$ |
| 6 | p GaAs | 2 | Ge | $2 \times 10^{18}$ | in which x=0.40 and y=0.09.

The radiation beam generated by this semiconductor laser has (in air or in vacuo) a wave length of 820 nm.

The active region 9 has a width of approximately 6 μm. The groove 8 has at the surface 7 a width of approximately 4 μm and a depth of approximately 2 μm.

The laser described has a stable radiation-versus-current characteristic without "kinks", which is of particular importance for telecommunication purposes.

According to the invention, the laser described can be advantageously manufactured in the following manner.

Figure 2:
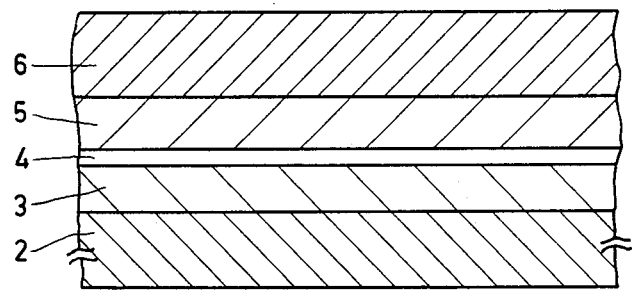
FIGS. 2 to 5 show diagrammatically in cross-section the semiconductor laser of FIG. 1 in successive stages of manufacture.

On a highly-doped substrate of n-type gallium arsenide having a doping of $10^{18}$ silicon atoms/cm$^3$, a thickness of 300 μm and a (100) orientation there are grown epitaxially in order of succession (see FIG. 2) a first passive layer 3 of n-type Al$_x$Ga$_{1-x}$As, in which x=0.40, having a thickness of 2 μm and a doping of $10^{17}$ tin atoms/cm$^3$, an undoped active layer 4 of GaAs (in this example weakly n-type conducting) having a thickness of approximately 0.2 μm, a second passive layer 5 of p-type Al$_x$Ga$_{1-x}$As$_1$, in which also x=0.40, having a doping of $5.10^{17}$ germanium atoms/cm$^3$ and a thickness of 1.9 μm and a top layer 6 of p-type GaAs having a doping of $2.10^{18}$ germanium atmos/cm$^3$ and a thickness of 2 μm. This epitaxial growth is preferably effected from the liquid phase according to a method generally used in the semiconductor laser technology. For the details of this method, which are not essential to the invention, reference may be made, for example, to the book "Crystal Growth from High Temperature Solutions" of D. Elwall and J. J. Scheel, Academic Press 1975, p. 433 to 467.

Figure 3:
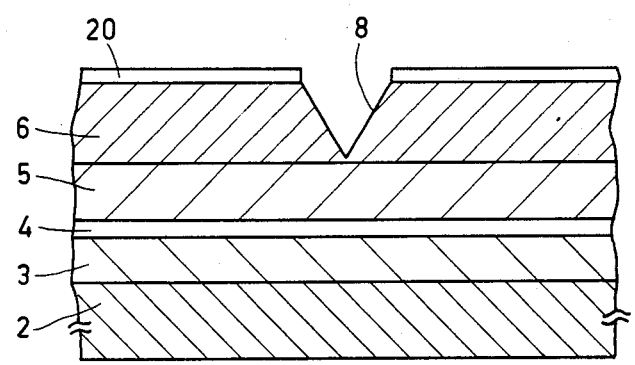

Subsequently, an etching mask 20 is provided on the top layer 6, see FIG. 3. In the present example, this etching mask consists of a silica layer.

There is provided in the etching mask 20 a strip-shaped aperture in the [1$\overline{1}$0]-direction by means of generally used photolithographic etching methods. A V-shaped groove 8 is then etched into the top layer 6. This may be effected, for example, with an etchant consisting of NH$_4$OH (25%), H$_2$O$_2$ (30%) and water in the ratio by volume of 1:1:10. Thus, the structure of FIG. 3 is obtained. The lowermost point of the groove 8 is located at a distance of approximately 2 μm from the layer 4. The walls of the groove 8 have a (111) orientation.

Figure 4:
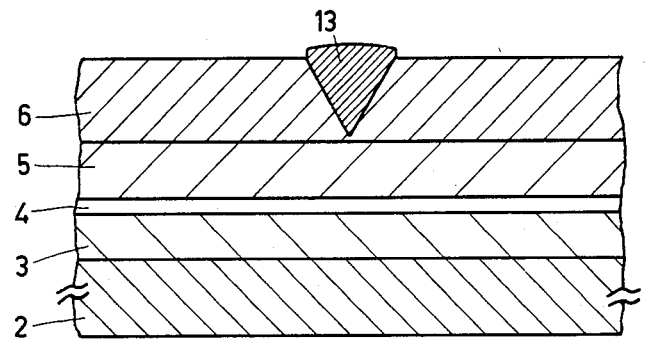

Subsequently (see FIG. 4) the groove 8 is selectively filled with gold 13. This may be advantageously effected by means of an electroless method, for example, in the manner indicated in U.S. application Ser. No. 491,823 which is incorporated by reference in the present Application. Thus, the situation of FIG. 4 is obtained, in which the groove is filled up to just above the surface.

Figure 5:
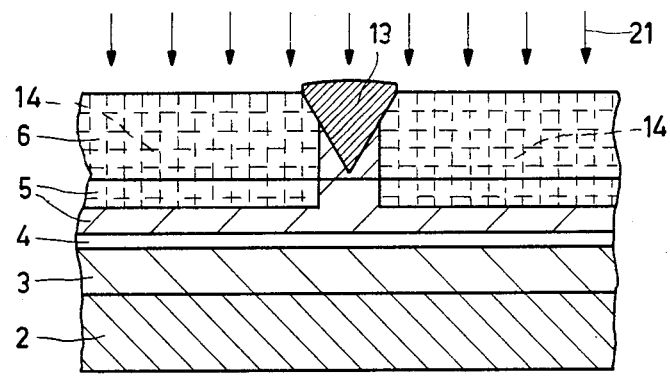

Then (see FIG. 5) a bombardment with protons 21 is carried out at the surface with an energy of approximately 190 keV and a dose of $10^{15}$ ions/cm$^2$. As a result, the electrically substantially insulating regions 14 are obtained. The gold 13 serves as a mask; from a certain minimum thickness of the gold, protons are not allowed to pass.

The substrate 2 is reduced by grinding and polishing to a thickness of 90 μm. Subsequently, the substrate and the upper surface are provided with metal layers 22 and 23 (see FIG. 1) and reflecting side surfaces 10 and 11 (with a (110) orientation) are then formed at a mutual distance of 250 μm by scribing and breaking, whereupon the laser is secured on the cooling plate 16 by means of a solder 15, preferably an indium-containing solder, and is further finished in the usual manner. The metal layer 23 in this example consists of a 50 nm thick chromium layer and thereon a 100 nm thick platinum layer and a 50 nm thick gold layer, while the metal layer 22 on the substrate 2 may consist of a gold-germanium-nickel layer. In order to improve the contact, the layers 22 and 23 are applied by alloying at a temperature of approximately 400° C.

Figure 6:
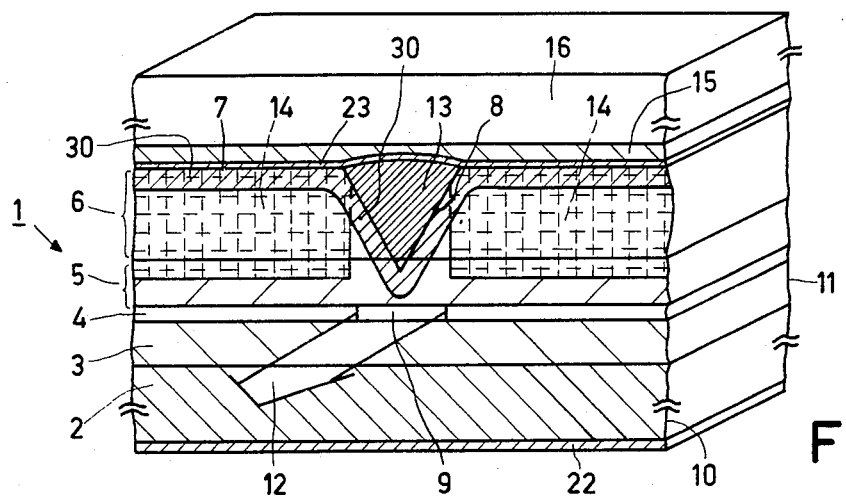
FIG. 6 shows a modification of the semiconductor laser of FIG. 1 partly diagrammatically in cross-section and partly in perspective view.

According to a modification, which is preferred under given conditions, an additional highly doped layer of the second (here p-) conductivity type can be diffused into the walls of the groove 8. As a result, an improved current concentration on the strip-shaped active region 9 can be attained, while at the same time an even better ohmic contact of the gold on the groove walls can be realized. Such a modification is shown diagrammatically in cross-section in FIG. 6. This device differs from that in FIG. 1 by the presence of a highly doped p-type layer 30, which extends along the walls of the groove 8 and also along the surface 7. Moreover, in this example, the groove 8 extends throughout the thickness of the top layer 6 into the second passive layer 5. The thickness of the layer 30 is approximately 0.5 μm. Further, the composition, the doping and the thickness of the various layers are in this example the same as in that of FIG. 1. The layer 30 may be provided, for example, by carrying out a zinc diffusion at 620° C. for 30 minutes after the groove 8 has been etched and after the etching mask 20 has been removed. The manufacture may further be carried out fully in the manner described with reference to FIGS. 2 to 5. If desired, the layer 30 may be diffused only into the walls of the groove 8, while the remaining part of the upper surface is masked against diffusion.

Modifications may be provided both in the structure of the semiconductor laser according to the invention and in its manufacture. Thus, the groove of the example of FIG. 1 may also extend into the second passive layer 5, while in FIG. 6, the groove could extend only over part of the thickness of the top layer 6 instead of throughout the top layer. The bottom of the groove 8 and the layer 30 are not allowed to extend into the active layer, however, which could lead to undesired crystal defects. Furthermore, instead of protons other ions, for example, H$_2^+$ or deuterium ions, may be implanted, while the electrically insulating regions may be formed in another manner than by ion implantation.

The metal 13 with which the groove 8 is filled may be a metal other than gold, while the filling process could take place instead of by an electroless method in another manner, for example, electrolytically. The soldering material 15 may be chosen quite independently of the metal 13. Also the composition, thickness and doping of the various semiconductor layers may be modified. The conductivity types of the various semiconductor regions may be replaced (simultaneously) by the opposite types.

Instead of silica, another material, such as, for example, silicon nitride, may be used for masking during etching of the groove 8.

The reflecting side surfaces (mirror surfaces) may be constituted, instead of by cleavage surfaces of the crystal, by side surfaces formed by etching or in another manner. If desired, they may be provided with a transparent coating for protection or for adjusting the reflection coefficient.

Finally, it should be noted that the presence of the top layer is not essential to the invention. When a good contact with the material of the passive layer 5 can be established by the metal 13, this layer may be made thicker and the top layer 6 may be omitted.

What is claimed is:

1. A semiconductor laser having a semiconductor body comprising at least a first passive semiconductor layer of a first conductivity type, an active semiconductor layer disposed thereon and a second passive semiconductor layer of a second, opposite conductivity type disposed on said active layer, a pn junction between the first and the second passive layers and a groove on the side of said second passive layer in the surface of said semiconductor body, which groove extends at most over only part of the thickness of said second passive layer, upon the application of a voltage in the forward direction across the pn junction by electrode means, coherent electromagnetic radiation being produced in a strip-shaped part of said active layer lying below said groove and situated between two reflecting side faces of said semiconductor body substantially at right angles thereto, for which radiation said passive layers have a lower refractive index than said active layer, characterized in that said groove is filled selectively with a metal at least up to the level of said surface and in that on both sides of said metal an electrically substantially insulating region is present which adjoins said metal and extends from the surface over part of the thickness of said second passive layer.

2. A semiconductor laser as claimed in claim 1, characterized in that a highly doped surface layer of the second conductivity type adjoins the groove walls and extends at most over only part of the thickness of said second passive layer.

3. A semiconductor laser as claimed in claim 1 or 2, characterized in that said second passive layer is provided with a semiconductor top layer which is of said second conductivity type and adjoins said surface.

4. A semiconductor laser as claimed in claim 1 or 2, characterized in that said groove comprises a V-shaped groove.

5. A semiconductor laser as claimed in claim 1 or 2, characterized in that said metal with which the groove is filled at least mainly comprises gold.

6. A semiconductor laser as claimed in claim 1 or 2, characterized in that said electrically substantially insulating region comprises implanted protons.

7. A semiconductor laser as claimed in claim 1 or 2, characterized in that said semiconductor layer consist of a semiconductor material selected from gallium arsenide and gallium aluminum arsenide.

8. A semiconductor laser as claimed in claim 1 or 2, characterized in that, on the side in which said groove is provided, said laser is soldered on a cooling plate by means of a soldering material different from the metal filling said groove.

* * * * *